United States Patent [19]

Shinozaki et al.

[11] Patent Number: 4,987,048
[45] Date of Patent: Jan. 22, 1991

[54] IMAGE FORMING MATERIAL

[75] Inventors: Fumiaki Shinozaki; Tomizo Namiki, both of Shizuoka, Japan

[73] Assignee: Fuji Photo Film Co. Ltd., Kanagawa, Japan

[21] Appl. No.: 393,069

[22] Filed: Aug. 7, 1989

Related U.S. Application Data

[63] Continuation of Ser. No. 64,429, Jun. 22, 1987, abandoned.

[30] Foreign Application Priority Data

Jun. 23, 1986 [JP] Japan ................................. 61-146580

[51] Int. Cl.$^5$ .......................... G03F 7/23; G03F 7/33; G03F 7/105
[52] U.S. Cl. ..................... 430/166; 430/160; 430/167; 430/175; 430/176; 430/192; 430/271; 430/293; 430/143
[58] Field of Search ............... 430/166, 167, 271, 293, 430/175, 176, 192, 160, 143

[56] References Cited

U.S. PATENT DOCUMENTS

| | | | |
|---|---|---|---|
| 4,123,276 | 10/1978 | Kita et al. | 430/176 |
| 4,268,601 | 5/1981 | Namiki et al. | 430/160 |
| 4,311,784 | 1/1982 | Fan | 430/166 |
| 4,473,494 | 9/1984 | Hallman et al. | 430/293 |
| 4,478,930 | 10/1984 | Shiba et al. | 430/166 |
| 4,504,566 | 3/1985 | Ducbar | 430/166 |
| 4,542,085 | 9/1985 | Takahashi et al. | 430/175 |
| 4,629,680 | 12/1986 | Iwasaki et al. | 430/281 |

Primary Examiner—Charles L. Bowers, Jr.
Attorney, Agent, or Firm—Sughrue, Mion, Zinn, Macpeak & Seas

[57] ABSTRACT

An image forming material comprising a support, a coloring material-containing organic polymer layer and a photosensitive resin layer in order in the form of a laminate, wherein the organic polymer of the organic polymer layer comprises a copolymer of an aralkyl (meth)acrylate and (meth)acrylic acid.

5 Claims, 1 Drawing Sheet

FIG. 1-(1)
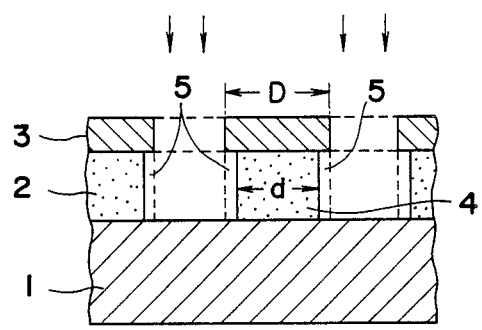
FIG. 1-(2)
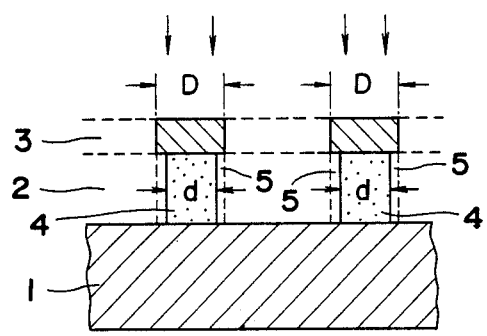

IMAGE FORMING MATERIAL

This is a continuation, of application Ser. No. 07/064,429 filed June 22, 1987.

BACKGROUND OF THE INVENTION

1. Field of the Invention

The present invention relates to an image forming material employable for display, for a color proof in color proofing and as a non-silver salt photosensitive film for printing.

2. Description of Prior Art

There are known image forming materials used in various fields of print, photograph and fine processing of metal, which comprise a photosensitive resin layer containing a photopolymer and a coloring material provided on a support (or temporary support in a transfer type image forming material).

The image forming materials having the above structure can be used for color proofing. A color proofing sheet can be obtained by exposing an image forming material (i.e., photosensitive sheet) to light through a color separation halftone film for each color plate, developing it to form a color separation image on a photosensitive resin layer, and transferring the color separation image to an arbitrary support (i.e., image receiving surface).

As an improved image forming material comprising two-layer structure, there have been proposed image forming materials wherein a coloring material-containing organic high-molecular polymer layer (sometimes called a coloring material layer) is interposed between the support and the photosensitive resin layer without incorporating any coloring material into the photosensitive resin layer. Examples of such image forming materials include those described in Japanese Patent Provisional Publications No. 47(1972)-16124, No. 52(1977)-89916, No. 55(1980)-117142, No. 55(1980)-12752 and U.S. Pat. No. 4,472,494. The image forming material comprising such three-layer structure that a coloring material-containing layer (or organic high-molecular polymer layer) and a photosensitive resin layer are independently provided as described above gives advantages as compared with the conventional image forming materials. In more detail, the improved image forming material is kept from lowering in sensitivity which is raised by lowering of exposure efficiency of the photosensitive layer caused by the co-existing color material in a conventional image forming process which comprises exposing an image forming material to light and developing the exposed material to form a color image. Further, when the image forming material is utilized as a non-silver salt lith type film (film having a high resolving power) for printing, the contrast of the obtained image is made very high. In other words, it gives appropriate halftone dot reducibility.

After the image forming material is exposed to light, the photosensitive resin layer is usually treated with a developing solution and the organic high-molecular polymer layer (coloring material layer) is developed (i.e., etched) to form an image. The image forming material can be classified into a positive type wherein the exposed portion of the photosensitive resin layer is removed by development and a negative type wherein unexposed portion is removed by development.

There have been previously proposed image forming materials in which the photosensitive resin layer and the corresponding underlaying layer, that is, the organic polymer layer (coloring material layer) are allowed to be simultaneously developed and removed. Such image forming materials are described in Japanese Patent Provisional Publications No. 52(1977)-89916 and No. 55(1980)-12752 and U.S. Pat. No. 4,472,494. Such image forming materials have an advantage in that the development (develpment of exposed portion or unexposed portion and etching of the coloring material-containing polymer layer) can be simultaneously conducted by a single treating solution (e.g., alkaline solution, etc.) so that the development step is simplified.

While the image forming materials of the three-layer structure type have the advantage described above, there is a disadvantage in that the underlaying layer, that is, the organic polymer layer (coloring material layer) is apt to suffer from side etching in the developement step for forming a color image at a degree higher than the photosensitive resin layer on the underlaying layer.

FIGS. 1-(1) and 1-(2) show sectional views wherein the above-mentioned side etching occurs in the case that a color image is formed by developing the image forming material after exposure to light. FIG. 1-(1) shows the sectional view of the side-etching observed in a positive type image and FIG. 1-(2) shows the sectional view of the side-etching observed in a negative type image. In FIGS. 1-(1) and 1-(2), numeral 1 indicates a support, 2 indicates an organic high-molecular polymer layer (coloring material layer), and 3 indicates a photosensitive resin layer. As shown in FIGS. 1-(1) and 1-(2), the color image portion 4 undergoes side etching 5 in the course of development so that the size d of the color image is reduced from the size D of the halftone dot of the original image. Accordingly, when a multi-color type color proof is prepared using such a color image, it is impossible to obtain precise reproduction of the colors of the original image.

SUMMARY OF THE INVENTION

It is an object of the present invention to provide an image forming material that is reduced in the side etching of the organic high-molecular polymer layer (i.e., coloring material layer) which occurs in the course of development and gives a color image in the form of an accurate duplicate of the original image.

The present invention resides in an image forming material comprising a support, a coloring material-containing organic high-molecular polymer layer and a photosensitive resin layer in order in the form of a laminate, wherein the organic high-molecular polymer of said organic high-molecular polymer layer contains a copolymer of at least one ester monomer selected from the group consisting of an aralkyl acrylate and aralkyl methacylate and at least one acid monomer selected from the group consisting of acrylic acid and methacrylic acid.

Accordingly, this invention resides in the discovery that side etching occurring on the polymer layer (coloring material layer) in the course of development after the exposure of the image forming material is effectively reduced using the specific copolymer as a binder for the coloring material layer.

In the image forming material of the invention, a copolymer of an aralkyl acrylate and/or an aralkyl methacrylate and acrylic acid and/or methacrylic acid is used as a binder for the coloring material-containing organic polymer layer. The above-mentioned copolymer has an appropriate solubility in developing solutions such as an alkaline developing solution. Accordingly, the side etching can be prevented or reduced, and the original image (image formed by halftone dots) is reproduced with high accuracy. This means that an error in dot size between the original image and the duplicated color image is minimized. Thus, the reproduction of the colors of the original can be made with high fidelity.

BRIEF DESCRIPTION OF THE DRAWING

FIG. 1-(1) shows a sectional view of a side-etched image formed on a conventional positive type image forming material.

FIG. 1-(2) shows a sectional view of a side-etched image formed on a conventional negative type image forming material.

DETAILED DESCRIPTION OF THE INVENTION

The image forming material of the present invention comprises basically a support, a coloring material-containing organic high-molecular polymer layer (coloring material layer) and a photosensitive resin layer in order in the form of a laminate.

The image forming material of the present invention is by no means limited to the structure described above, and may have other structure. For example, there may be provided a protective layer on the photosensitive resin layer. One or more intermediate layers may be provided between the support and the organic polymer layer (coloring material layer).

The image forming material having the above structure according to the present invention can be prepared, for example, by the following procedure.

As the material for the support, a material which is chemically and thermally stable and flexible is used. If desired, the material may be actinic ray-transmissive. Examples of the material for the support include polyolefins such as polyethylene and polypropylene; polyvinyl halides such as polyvinyl chloride and polyvinylidene chloride; cellulose derivatives such as cellulose acetate, nitrocellulose and cellophane; polyamide, polystyrene, polycarbonate, polyimide and synthetic paper. A biaxially oriented polyethylene terephthalate film is particularly preferred, because it has excellent dimensional stability and transparency.

The surface of the support facing the coloring material-containing organic polymer layer may be subjected to various treatments to control adhesion between the support and the polymer layer. Alternatively, an undercoat layer as an intermediate layer may be provided between the support and the polymer layer.

The coloring material-containing organic high-molecular polymer layer is then provided on the support.

The organic high-molecular polymer layer is a layer comprising a coloring material and a binder. The binder of the present invention is characterized by comprising a copolymer of at least one ester monomer selected from the group consisting of an aralkyl acrylate and an aralkyl methacrylate and at least one acid monomer selected from the group consisting of acrylic acid and methacrylic acid.

The alkyl moiety of the aralkyl group in the monomers such as the aralkyl acrylate and aralkyl methacrylate preferably is a lower alkyl having 1 to 6 carbon atoms.

Preferred examples of the aralkyl acrylates include benzyl acrylate, phenethyl acrylate and 3-phenylpropyl acrylate.

Preferred examples of the aralkyl methacrylates include benzyl methacrylate, phenethyl methacrylate and 3-phenylpropyl methacrylate.

Preferably, the mixing ratio (molar ratio) of the ester monomer (i.e., aralkyl acrylate and/or the aralkyl methacrylate) to the acid monomer (i.e., acrylic acid and/or methacrylic acid) is in the range of 75:25 to 40:60. Particularly, when development (i.e., etching) is carried out using a weak alkaline developing solution such as a sodium carbonate-containing solution, the molar ratio in the range of 67:33 to 40:60 is preferred.

If desired, the copolymer may contain a repeating unit derived from other vinyl compound as a third component.

Examples of the other vinyl compounds include styrene, substituted styrenes such as vinyltoluene, p-chlorostyrene, $\alpha$-chlorostyrene, $\alpha$-methylstyrene, vinylethylbenzene, o-methoxystyrene and m-bromostyrene; vinylnaphthalene and substituted vinylnaphthalenes; vinyl heterocyclic compounds such as N-vinylcarbazole, vinylpyridine and vinyloxazole; vinylcycloalkanes such as vinylcyclohexane and 3,5-dimethylvinylcyclohexane; acrylamide, methacrylamide, N-alkylacrylamides, acrylonitrile, methacrylonitrile, aryl methacrylates, aralkyl methacrylates and their analogues. Among them, styrene is most preferred.

Preferably, the amount of the third component in the copolymer should be not more than 20 mol %.

As the coloring material to be incorporated in the organic high-molecular polymer layer, any of conventional dyes or pigments may be used. Examples of the coloring materials include compounds described in "Color Index", "Handbook of Dye" edited by Organic Synthetic Chemical Society (publised by Maruzen Co., Ltd., 1970, in Japanese) and "Handbook of New Pigments" edited by Pigment Technical Society of Japan (1977) (in Japanese).

In the formation of the coloring material-containing organic high-molecular polymer layer (coloring material layer), a coloring material and the binder of the present invention are dissolved in a solvent to prepare a coating solution for the formation of the organic polymer layer (coloring material layer). Examples of the solvents include ketones such as acetone, methyl ethyl ketone and cyclohexanone; acetates such as methyl acetate and ethyl acetate; ethers such as methyl cellosolve, dioxane and tetrahydrofuran; methylene chloride; and diacetone alcohol. These solvents may be used alone or in combination of two or more of them.

The coloring material layer can be formed in such a manner that the support is coated with said coating solution by any of conventional methods, for example using a whirler, and then dried.

The ratio of the coloring material to the binder in the polymer layer varies depending on the type of the image forming material, but the coloring material is generally used in an amount of 5 to 50% by weight based on the amount of the binder. Generally, when the image forming material is used in the field of non-silver salt contact film, a large amount of the coloring material is used, because a sufficient optical density is required. When the material is used in the field of color proof of overlay type, the amount of the coloring material is relatively small, because the optical density required may be relatively low.

The thickness of the organic high-molecular polymer layer (coloring material layer) preferably is in the range of 0.1 to 10 μm, more preferably 0.1 to 3 μm.

A photosensitive layer is then provided on the organic high-molecular polymer layer.

The photosensitive resin layer is a layer comprising a photosensitive film-forming substance and having such properties that after exposure operation, exposed portion and unexposed part are made different in solubility in solvents such as a developing solution. By utilizing the properties, either portion can be selectively removed. A great number of materials having such properties are known. Typical examples of the materials include photopolymerizable compounds, photolytic compounds and photocrosslinkable compound.

Examples of the photopolymerizable compounds include monomers having a boiling point of not lower than 150° C. under atmospheric pressure and capable of forming a polymer through addition polymerization. Examples of the monomers include polyfunctional vinyl monomers and vinylidene compounds.

Unsaturated esters of polyols, particularly acrylates and methacrylates of polyols are preferred as the vinyl monomers or vinylidene compounds. Examples of such compounds include ethylene glycol diacrylate, glycerol triacrylate, polyacrylates, ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate, bisacrylate and bismethacrylate of polyethylene glycol having a molecular weight of 200 to 400 and their analogues.

An unsaturated amide can also be used as the monomer compound. Examples of the unsaturated amides include unsaturated amides of acrylic acid and methacrylic acid containing α, -diamine and ethylenebismethacrylamide. The alkylene chain of the unsaturated amide may be opened at the carbon atom. The photopolymerizable monomers are not limited to the compounds described above, but other compounds may be used.

The photosensitive resin layer containing the photopolymerizable compound further contains an organic polymer binder and a photopolymerization initiator which is activated by actinic rays. If desired, a heat polymerization inhibitor may be added.

Examples of the photopolymerization initiators include aromatic ketones such as benzophenone, Michler's ketone [4,4'-bis(dimethylamino)benzophenone], 4-methoxy-4'-dimethylaminobenzophenone, 2-ethylanthraquinone, phenanthraquinone and the like; benzoin and benzoin ethers such as benzoin methyl ether, benzoin ethyl ether and benzoin phenyl ether; benzoins such as methylbenzoin and ethylbenzoin; and imidazoles such as 2-(o-chlorophenyl)-4,5-diphenylimidazole dimer, 2-(o-chlorophenyl)-4,5-(m-methoxyphenyl) imidazole dimer, 2-(o-fluorophenyl)-4,5diphenylimidazole dimer, 2-(o-methoxypenyl)-4,5-diphenylimidazole dimer, 2-(p-methoxyphenyl)-4,5-diphenylimidazole dimer, 2,4-di(p-methoxyphenyl)5-phentylimidazole dimer, 2-(2,4-dimethoxyphenyl)4,5-diphenylimidazole dimer, 2-(p-methylmercaptophenyl)-4,5-diphenylimidazole dimer and 2,4,5-triacrylimidazole dimer as described in U.S. Pat. Nos. 3,479,185 and 3,784,557 and U.K. Patent No. 1,047,569.

As the organic polymer binder, high-molecular vinyl materials are preferred from the viewpoint of compatibility with said monomer compounds and said photopolymerization initiator.

Examples of the high-molecular vinyl materials include polyvinyl chloride, polyacrylic acid, polymethyl acrylate, polyethyl acrylate, polybutyl acrylate, polymethacrylic acid, polymethyl methacrylate, polyvinyl ether, polyvinyl acetal and copolymers thereof, but they are not limited to the compounds described above and other compounds may be used.

The mixing ratio of the monomer compound and the organic polymer binder varies depending on the natures of the monomer and the binder, but preferably is in the range of 1:10 to 2:1 by weight. The photopolymerization initiator is used preferably in an amount of 0.01 to 20% by weight based on the amount of the monomer compound.

Examples of the heat polymerization inhibitors include p-methoxyphenol, hydroquinone, alkyl- or aryl-substituted hydroquinones, t-butyl catechol, pyrogallol, naphthylamine, β-naphthol, phenathiazine, pyridine, nitrobenzene, o-toluquinone, aryl phosphites. However, the inhibitors are not limited thereto, and other compounds may be used.

Examples of the photolytic compound include quinone diazide photosensitive materials.

A typical example of the photo-crosslinkable compound is a polyvinyl cinnamate derived from polyvinyl alcohol. Other examples of the photo-crosslinkable compounds include compounds having azido group as a photosensitive group. The compound having azido group may be used in combination with a binder such as polyacrylamide, polyacrylonitrile, alcohol-soluble nylon, rubber, styrene-butadiene copolymer or phenolic resin.

As the photosensitive material used in the photosensitive resin layer, there is preferred the photopolymerizable compound or the photolytic compound, because the photosensitive resin layer and the polymer layer (i.e., coloring material layer) can be simultaneously developed (alkali-treated) by a single operation.

The photosensitive resin layer can be formed by dissolving the photosensitive material and the organic polymer binder in an appropriate solvent to prepare a coating solution (photosensitive solution), applying the coating solution to the surface of the coloring material layer and drying it.

The thickness of the photosensitive resin layer varies depending on the type of the image forming material or the photosensitive material, and is generally in the range of 0.1 to 20 μm, preferably 0.4 to 5 μm.

Materials for the photosensitive resin layer and methods for the formation thereof are described in Japanese Patent Publications No. 46(1971)-15326, No. 46(1971)-35682 and No. 55(1980)-6210 and Japanese Patent Provisional Publications No. 44(1969)-72494, No. 47(1972)-41830, No. 48(1973)-93337, No. 49(1974)-441, No. 51(1976)-5101, No. 59(1984)-97140 and No. 60(1985)-46694 and U.S. Pat. No. 3,887,450 in addition to the aforementioned patent publications.

The image forming material of the present invention may be provided with a protective layer to improve resistance or to prevent lowering in sensitivity caused by oxygen. The protective layer can be formed, for example, by coating a solution of a high-molecular weight material and drying it. Examples of the high-molecular weight material include polyvinyl alcohol, polyvinyl acetate, methyl vinyl ether-maleic adhydride copolymer, polyinyl pyrrolidone, gelatin and gum arabic.

The following examples are provided to illustrate the present invention without limiting it thereto.

EXAMPLE 1

A pigment dispersion having the composition shown in Table 1 was prepared for each of four colors [yellow(Y), magenta(M), cyan(c) and black(B)], by conducting for 3 hours a dispersing procedure using a test dispersion mixer (paint shaker, manufactured by Toyo Seiki Co., Ltd.).

TABLE 1

| Formulation | Pigment dispersion (g) | | | |
|---|---|---|---|---|
| | Yellow | Magenta | Cyan | Black |
| Seika Fast Yellow (H-0755) (Dainichiseika Color & Chemicals Mfg. Co., Ltd.) | 10.0 | — | — | — |
| Seika Fast Carmine (1483) (Dainichiseika Color & Cheminals Mfg. Co., Ltd.) | — | 8.0 | — | — |
| Cyanine Blue (4920) (Dainichiseika Color & Chemicals Mfg. Co., Ltd.) | — | — | 10.0 | — |
| Carbon Black (MA-100) (Mitsubishi Chemical Industries, Ltd.) | — | — | — | 7.0 |
| Benzyl methacrylate/methacrylic acid/acrylic acid copolymer (molar ratio: 50/35/15) | 15.0 | 16.0 | 15.0 | 21.0 |
| Methyl ethyl ketone | 50.0 | 50.0 | 50.0 | 50.0 |
| Methyl cellosolve acetate | 25.0 | 25.0 | 25.0 | 25.0 |

The resulting dispersion was then mixed with other materials according to the formulation set out in Table 2 to prepare a coating solution for the formation of the organic high-molecular polymer layer (coloring material layer) for each of the four colors.

TABLE 2

| Formulation | Coating solution for formation of organic high-molecular polymer layer (coloring material layer) (g) | | | |
|---|---|---|---|---|
| | Yellow | Magenta | Cyan | Black |
| Pigment dispersion (yellow) | 15.8 | — | — | — |
| Pigment dispersion (magenta) | — | 11.3 | — | — |
| Pigment dispersion (cyan) | — | — | 10.2 | — |
| Pigment dispersion (black) | — | — | — | 17.2 |
| Fluorine-containing surfactant | 0.3 | 0.3 | 0.3 | 0.3 |
| Benzyl methacrylate/methacrylic acid/acrylic acid copolymer (molar ratio: 50/35/15) | 4.0 | 5.0 | 5.6 | 2.7 |
| Acetone | 26.1 | 54.0 | 26.1 | 26.1 |
| n-Propyl alcohol | 136.0 | 108.0 | 136.0 | 136.0 |

The surface of a polyethylene terephthalate film (support, thickness:100 μm) was coated with the coating solution at a rotation speed of 100 r.p.m. by means of a whirler, and dried at 100° C. for two minutes to form a coloring material layer for each of the four colors.

A positive type photosensitive solution (coating solution for the formation of the photosensitive resin layer) having the following composition was applied to the coloring material layer for each of the four colors at a rotation speed of 100 r.p.m. by means of a whirler, and dried at 100° C. for two minutes to prepare each of a yellow-colored photosensitive sheet, a magenta-colored photosensitive sheet, a cyan-colored photosensitive sheet and a black-colored photosensitive sheet (image forming materials).

| Coating solution for photosensitive resin layer | |
|---|---|
| Adduct of 2-diazo-1-naphthol-4-sulfonyl chloride to a condensate (average polymerization degree: (3) of acetone and pyrogallol | 15 g |
| Novolak type phenol-formaldehyde resin (PR-50716, manufactured by Sumitomo Dures Co., Ltd.) | 30 g |
| Tricresyl phosphate | 5 g |
| Cyclohexanone | 120 g |
| n-Propyl acetate | 280 g |

Evaluation on the color image of the photosensitive sheets (for four colors) was made in the following manner.

The photosensitive sheet for each of the four colors and each of the corresponding color separation mask were used, and exposure was carried out imagewise for 60 sec. using 1 Kw ultrahigh pressure mercury vapor lamp (P-607FW, manufactured by Dainippon Screen Mfg Co., Ltd.). Automatic development was then carried out at 31° C. for 34 seconds using a diluted solution (diluted five times) of a commercially available developer (tradename: Fuji Color Art Developer CA-1, manufactured by Fuji Photo Film Co., Ltd.) and Fuji Color Art Processor CA-600 P (manufactured by Fuji Photo Film Co., Ltd.)

The resulting image was examined and acknowledged that the coloring material layer did not suffer from side etching, and the halftone dots of the original image were reproduced with high fidelity. The color images of the four colors were placed together on a white mount by registration and could be used satisfactorily as a color proof.

EXAMPLE 2

A pigment dispersion having the following composition was prepared by performing for 3 hours a dispersing procedure using a test dispersion mixer (paint shaker, manufactured by Toyo Seiki Co., Ltd.).

| Pigment Dispersion | |
|---|---|
| Benzyl methacrylate/methacrylic acid copolymer (molar ratio: 60/40) | 22.5 g |
| Carbon Black MA-100 (manufactured by Mitsubishi Chemical Industries, Ltd.) | 15.0 g |
| Methyl ethyl ketone | 62.5 g |

The pigment dispersion was mixed with other materials to obtain a diluted dispersion having the following composition. The dispersion was stirred for 10 minutes and subjected to ultrasonic dispersion for 10 minutes to prepare a coating solution for the formation of a coloring material layer.

| Coating solution for coloring material layer | |
|---|---|
| Fluorine-containing surfactant (Flolard FC-430, manufactured by Sumitomo 3M Co., Ltd.) | 0.5 g |
| Benzyl methacrylate/methacrylic acid copolymer (molar ratio: 60/40) | 40.0 g |
| Pigment dispersion | 40.0 g |
| Methyl ethyl ketone | 260.0 g |

| Coating solution for coloring material layer | |
|---|---|
| Methyl cellosolve acetate | 130.0 g |

In a similar manner to that described in Example 1, a polyethylene terephtahlate film (support, thickness: 100 μm) was coated with the above coating solution to form a coloring material layer of 2.5 μm thick. Further, the surface of the coloring material layer was coated with the photosensitive solution of Example 1 to form a photosensitive resin layer of 1 μm thick. Thus, a photosensitive sheet (image forming material) was prepared.

Evaluation on the photosensitive sheet was made by the following resolving power test.

The optical density of the photosensitive sheet was measured by Macbeth densitometer. Optical density (OD) was not lower than 3.5.

TEST OF RESOLVING POWER

A test sheet (orginal) having a combination of a resolving power chart and 5-95% halftone dots was used and the photosensitive sheet was exposed imagewise for 60 seconds to light radiated by 1 KW ultrahigh pressure mercury vapor lamp (P607FW, manufactured by Dainippon Screen Mfg Co., Ltd.). Subsequently, development was conducted at 31° C. for 40 seconds using a developing solution having the following composition.

| Developing solution | |
|---|---|
| $Na_2CO_3$ | 15 g |
| Butyl cellosolve | 3 g |
| Distilled water | 1 l |

It was confirmed that the resulting image accurately reproduced 175 lines/mm and 5-95% halftone dots of the original test sheet.

We claim:

1. An image forming material comprising a support, a coloring material layer consisting essentially of an organic high-molecular polymer and a coloring material, and a photosensitive resin layer consisting essentially of a photosensitive film-forming substance in order in the form of a laminate, wherein after exposure to actinic rays, the exposed portion of said photosensitive resin layer has a solubility in an alkaline developing solution different from that of the unexposed portions, wherein said coloring material layer shows substantially no side etching upon image-wise exposure and development, and wherein the high-molecular polymer consists essentially of a copolymer of at least one ester monomer selected from the group consisting of an aralkyl acrylate and an aralkyl methacrylate and at least one acid monomer selected from the group consisting of acrylic acid and methacrylic acid, said ester monomer and acid monomer being in a molar ratio of 75:25 to 40:60.

2. The image forming material as claimed in claim 1, wherein the ester monomer is at least one aralkyl acrylate selected from the group consisting of benzyl acrylate, phenethyl acrylate and 3-phenylpropyl acrylate.

3. The image forming material as claimed in claim 1, wherein the ester monomer is at least one aralkyl methacrylate selected from the group consisting of benzyl methacrylate, phenethyl methacrylate and 3-phenylpropyl methacrylate.

4. The image forming material as claimed in claim 1, wherein the organic high-molecular polymer layer has a thickness of 0.1 to 10 μm.

5. The image forming material as claimed in claim 1, wherein said photosensitive layer consists essentially of photolytic quinone diazide and an organic polymer binder.

* * * * *